US008372564B2

(12) United States Patent
Shoki

(10) Patent No.: US 8,372,564 B2
(45) Date of Patent: Feb. 12, 2013

(54) REFLECTIVE MASK, REFLECTIVE MASK BLANK AND METHOD OF MANUFACTURING REFLECTIVE MASK

(75) Inventor: Tsutomu Shoki, Tokyo (JP)

(73) Assignee: Hoya Corporation, Tokyo (JP)

( * ) Notice: Subject to any disclaimer, the term of this patent is extended or adjusted under 35 U.S.C. 154(b) by 111 days.

(21) Appl. No.: 12/990,881

(22) PCT Filed: Apr. 27, 2009

(86) PCT No.: PCT/JP2009/058244
§ 371 (c)(1),
(2), (4) Date: Nov. 3, 2010

(87) PCT Pub. No.: WO2009/136564
PCT Pub. Date: Nov. 12, 2009

(65) Prior Publication Data
US 2011/0059391 A1   Mar. 10, 2011

(30) Foreign Application Priority Data

May 9, 2008  (JP) .................................. 2008-122950

(51) Int. Cl.
*G03F 1/24*   (2012.01)
(52) U.S. Cl. .......................................................... 430/5
(58) Field of Classification Search .............. 430/5, 322, 430/323, 324; 378/35; 428/428, 430
See application file for complete search history.

(56) References Cited

U.S. PATENT DOCUMENTS 6,178,221 B1 * 1/2001 Levinson et al. ................ 378/35
6,984,475 B1   1/2006 Levinson et al.
2006/0222961 A1 * 10/2006 Yan .................................... 430/5

FOREIGN PATENT DOCUMENTS

| JP | 62-050811 B2 | 4/1982 |
| JP | 04-039660 A | 2/1992 |
| JP | 06-282063 A | 10/1994 |
| JP | 08-213303 A | 8/1996 |
| JP | 08-325560 A | 12/1996 |
| JP | 2003-338461 A | 11/2003 |
| JP | 2004-207593 A | 7/2004 |
| JP | 2007-005523 A | 1/2007 |

* cited by examiner

*Primary Examiner* — Stephen Rosasco
(74) *Attorney, Agent, or Firm* — Sughrue Mion, PLLC

(57) ABSTRACT

A reflective mask of this invention includes a multilayer reflective film (13), on a substrate (11), having a structure in which high refractive index layers and low refractive index layers are alternately laminated, and an absorbing film (15) stacked on the multilayer reflective film (13) and adapted to absorb EUV exposure light. The absorbing film (15) is a phase shift film that allows the EUV exposure light having passed therethrough and reflected by the multilayer reflective film to have a predetermined phase difference with respect to the EUV exposure light directly incident on and reflected by the multilayer reflective film. A plurality of the layers or all the layers of the multilayer reflective film (13) in a blind area are removed from its upper layer.

21 Claims, 6 Drawing Sheets

REFLECTIVE MASK, REFLECTIVE MASK BLANK AND METHOD OF MANUFACTURING REFLECTIVE MASK

TECHNICAL FIELD

This invention relates to a reflective mask blank and a reflective mask. More specifically, this invention relates to a reflective mask suitable as a reflective mask for use in a lithography method using exposure light in a short wavelength region such as extreme ultraviolet light and to a reflective mask blank for such a reflective mask.

BACKGROUND ART

In recent years, with higher integration of semiconductor devices, fine patterns exceeding the transfer limit of a photolithography method using the conventional ultraviolet light have been required in the semiconductor industry. In order to enable transfer of such fine patterns, the EUV lithography being an exposure technique using extreme ultraviolet light (hereinafter referred to as EUV light) with a shorter wavelength is expected to be promising. The EUV light represents light in a wavelength band of the soft X-ray region or the vacuum ultraviolet region and, specifically, light having a wavelength of about 0.2 nm to 100 nm. As an exposure mask for use in the EUV lithography, there is proposed a reflective mask as described in Patent Document 1.

This reflective mask has a structure in which a multilayer reflective film for reflecting the EUV light serving as exposure light is formed on a substrate and, further, an absorber film for absorbing the EUV light is formed in a pattern on the multilayer reflective film. When pattern transfer is carried out using an exposure apparatus (pattern transfer apparatus) with the reflective mask disposed therein, the exposure light incident on the reflective mask is absorbed at a portion where the absorber film pattern is present, but is reflected by the multilayer reflective film at a portion where the absorber film pattern is not present. The light reflected by the multilayer reflective film is irradiated onto, for example, a semiconductor substrate (resist-coated silicon wafer) through a reflective optical system so that the absorber film pattern of the reflective mask is transferred.

Apart from the reduction in wavelength of light, a resolution improvement technique using a phase shift mask is proposed by Levenson et al. of IBM (e.g. Patent Document 2). In the phase shift mask, a transmitting portion of a mask pattern is made of a substance or has a shape which is different from that of its adjacent transmitting portion so that a phase difference of 180 degrees is given to lights transmitted therethrough. Therefore, in an area between both transmitting portions, the transmitted diffracted lights different in phase by 180 degrees cancel each other out and thus the light intensity becomes extremely small to improve the mask contrast. As a result, the depth of focus upon transfer increases to improve the transfer accuracy. The phase difference is theoretically best at 180 degrees, but if it is substantially about 175 to 185 degrees, a resolution improvement effect is obtained.

A halftone mask which is one type of a phase shift mask is a phase shift mask that improves the resolution of a pattern edge portion by using a light-absorbing thin film as a material of a mask pattern to give a phase difference of 180 degrees with respect to normal light transmitted through a substrate while reducing the transmittance to about several % (normally about 5% to 20%). As a light source, it is currently shifting from a KrF excimer laser (wavelength 248 nm) hitherto used to an ArF excimer laser (wavelength 193 nm).

However, even with the ArF excimer laser, in terms of additional problems in exposure apparatus and resist, the lithography technique using the halftone mask is not easily applied as a futuristic lithography technique for manufacturing a device with a line width of 50 nm or less.

In view of this, in order to further improve the transfer resolution of the EUV lithography, there is proposed an EUV exposure mask that makes it possible to apply the theory of a halftone mask used in conventional excimer laser exposure or the like to the EUV lithography using a reflective optical system (e.g. Patent Document 3).

PRIOR ART DOCUMENT

Patent Document

Patent Document 1: JP-A-H8-213303
Patent Document 2: JP-B-S62-50811
Patent Document 3: JP-A-2004-207593

SUMMARY OF THE INVENTION

Problem to be Solved by the Invention

Hereinbelow, a related EUV exposure mask will be described with reference to FIG. 6. An upper view of FIG. 6 is a cross-sectional view of the related EUV exposure mask and a lower view of the same figure is a plan view showing part of it. As shown in the upper view of FIG. 6, the related EUV exposure mask is such that a multilayer film (multilayer reflective film) 111 adapted to serve as a high-reflection area for exposure light is formed on a substrate 110 and a pattern of a low-reflection layer (absorber film) 112 adapted to serve as a low-reflection area 0 is formed on the multilayer film 111. The low-reflection layer 112 is in the form of a two-layer film and is characterized in that the reflectance of the low-reflection layer 112 is 5% to 20% at the exposure wavelength when the reflectance of the multilayer film 111 is given as a reference and that the phase difference between reflected light from the low-reflection layer 112 and reflected light from the multilayer film 111 is 175 to 185 degrees at the exposure wavelength. This EUV exposure mask has a transfer area 114 where a transfer pattern 113 is formed, and a remaining blind area 115. As will be described later, the blind area 115 includes a leakage light area 116 and an outside area 117. Alignment marks 118 are formed in the outside area 117. The transfer area 114 and the leakage light area 116 form an area 119 on which exposure light is incident.

The EUV exposure mask with such a structure makes it possible to apply the theory of the halftone mask used in the conventional excimer laser exposure or the like also to the EUV exposure and the reflective optical system and thus to realize an improvement in transfer resolution by the EUV exposure and the halftone effect.

In the meantime, there has been a problem unique to the EUV exposure mask that when EUV exposure light is irradiated onto the EUV exposure mask, the multilayer reflective film 111 is electrostatically charged. However, this problem has basically been solved by connecting the multilayer reflective film 111 or the absorber film 112 to ground.

Generally, in the manufacture of semiconductor devices, exposure is carried out a plurality of times on a single transfer target formed with a resist film, using the same photomask while shifting the position, thereby transferring the same pattern a plurality of times to the single transfer target.

Primarily, it is ideal that exposure light irradiated from a light source in an exposure apparatus is incident only on a portion, where the pattern 113 to be transferred is formed, (i.e. the transfer area 114) of a photomask surface, and this is contrived by adjustment with an optical system in the exposure apparatus. However, due to light diffraction phenomenon, positional accuracy, or the like, it is not possible to avoid a phenomenon in which part of the exposure light leaks (this will be referred to as leakage light) to be incident even on part of the blind area 115 outside the transfer area 114 (hereinafter, this part of the blind area 115 exposed to the leakage light will be referred to as the leakage light area 116). As a result, as shown in the lower view of FIG. 6, the area including not only the transfer area 114 but also the leakage light area 116 is transferred to a resist film of a transfer target.

Generally, when transferring the transfer pattern 113 of the photomask a plurality of times to a resist film formed on a transfer target (wafer or the like) using the exposure apparatus, the transfer pattern 113 of the transfer area 114 is transferred on the transfer target with almost no gap from each other as shown in FIG. 7 in order to utilize the transfer target most effectively (see transfer patterns 113A, 113B, 113C, 113D, etc. in FIG. 7).

In this event, for example, when transferring the transfer pattern 113B with almost no gap after transfer of the transfer pattern 113A, a leakage light area 116B of the transfer pattern 113B overlaps part of the transfer pattern 113A. Further, a leakage light area 116A of the transfer pattern 113A overlaps part of the transfer pattern 113B.

In the case of a reflective mask of the type that EUV exposure light is absorbed by an absorber film 112, even if the EUV exposure light leaks to a leakage light area 116, the absorber film 112 absorbs the EUV exposure light so that there is no occurrence of reflected light, having an intensity strong enough to sensitize a resist film on a transfer target, from the absorber film 112 in the leakage light area 116 and, therefore, no particular problem arises.

However, in the case of the EUV exposure mask using the halftone effect, since the absorber film transmits EUV exposure light at a predetermined transmittance, reflected light from the leakage light area 116 also occurs. As a result, there is a problem that if the transfer pattern 113 and the leakage light area 116 overlap each other on the transfer target, the resist film on the transfer target is unintentionally sensitized.

Hereinbelow, a description will be given in detail with reference to FIG. 7. As described before, when transferring the transfer pattern 113 of the photomask a plurality of times to the resist film on the transfer target using the exposure apparatus, exposure is sequentially carried out such that, for example, the transfer pattern 113A is transferred to the transfer target by first exposure, the transfer pattern 113B is transferred by second exposure, the transfer pattern 113C is transferred by third exposure, and the transfer pattern 113D is transferred by fourth exposure, followed by subsequent exposure. In this case, due to overlapping between a low-reflection portion (portion that does not serve to sensitize the resist film on the transfer target) being a portion where the absorber film 112 of the transfer pattern remains and the leakage light area 116 of a portion where the absorber film 112 remains, a portion 120 subjected to overlapping of twice exposure, a portion 121 subjected to overlapping of three-times exposure, and a portion 122 subjected to overlapping of four-times exposure are formed on the resist film on the transfer target.

Normally, in the case of a reflective mask for EUV exposure, even when EUV light is directly incident on and reflected by a multilayer reflective film, the reflectance is about 70% and, therefore, the light quantity or the like of an EUV light source is adjusted so that a resist film on a transfer target can be sensitized with the quantity of this 70% reflected light. For example, in the case of using a reflective mask having a reflectance of about 20% when EUV light is reflected by a multilayer reflective film 111 through an absorber film 112, a resist film on a transfer target is exposed to EUV light having a light quantity corresponding to a reflectance of about 40% at a portion 120 subjected to overlapping of twice exposure so that there is a possibility of sensitization of the resist film at portions that should not primarily be sensitized. Likewise, the resist film on the transfer target is exposed to EUV light having a light quantity corresponding to a reflectance of about 60% at a portion 121 subjected to overlapping of three-times exposure and is exposed to EUV light having a light quantity corresponding to a reflectance of about 80% at a portion 121 subjected to overlapping of four-times exposure so that there is a high possibility of sensitization of the resist film at portions that should not primarily be sensitized.

This invention has been made in view of the above circumstances and has an object to provide an EUV exposure mask that uses the theory of a halftone mask, wherein even if transfer patterns are transferred on a resist film of a transfer target with no gap therebetween such that a low-reflection portion of a transfer area and a leakage light area of a blind area overlap each other, the resist is not sensitized at an overlapping portion therebetween, and a mask blank for manufacturing such a mask.

Means for Solving the Problem

A reflective mask of this invention is a reflective mask that is produced by forming a transfer pattern in an absorbing film of a reflective mask blank comprising a multilayer reflective film, on a substrate, having a structure in which high refractive index layers and low refractive index layers are alternately laminated, and the absorbing film stacked on the multilayer reflective film and adapted to absorb EUV exposure light. The reflective mask is characterised in that the absorbing film is a phase shift film that allows the EUV exposure light having passed therethrough and reflected by the multilayer reflective film to have a predetermined phase difference with respect to the EUV exposure light directly incident on and reflected by the multilayer reflective film, and a plurality of the layers or all the layers of the multilayer reflective film in a blind area are removed from its upper layer.

According to this structure, since the contrast can be obtained between the reflectance of the absorbing film and the reflectance of the blind area, it is possible to suppress sensitization of a resist film due to reflected light in the blind area.

In the reflective mask of this invention, it is preferable that an area where the plurality of layers or all the layers of the multilayer reflective film in the blind area are removed from its upper layer is an area including at least a leakage light area.

A reflective mask blank of this invention is a reflective mask blank that includes a substrate, a multilayer reflective film, on the substrate, having a structure in which high refractive index layers and low refractive index layers are alternately laminated, and an absorbing film stacked on the multilayer reflective film and adapted to absorb EUV exposure light. The reflective mask blank is characterized in that the absorbing film is a phase shift film that allows the EUV exposure light having passed therethrough and reflected by the multilayer reflective film to have a predetermined phase difference with respect to the EUV exposure light directly incident on and reflected by the multilayer reflective film, and a conductive film is interposed between the substrate and the multilayer reflective film.

In the reflective mask blank of this invention, it is preferable that the conductive film is formed of a material composed mainly of one of chromium, chromium nitride, chromium oxide, chromium carbide, chromium oxynitride, chromium carbonitride, chromium oxycarbide, and chromium oxycarbonitride.

In the reflective mask blank of this invention, it is preferable that the absorbing film has a structure in which an antireflection film is laminated on a semitransmissive film.

In the reflective mask blank of this invention, it is preferable that the antireflection film is formed of a material having etching selectivity to an etching gas for use in etching the semitransmissive film.

In the reflective mask blank of this invention, it is preferable that the semitransmissive film is formed of a material composed mainly of tantalum.

In the reflective mask blank of this invention, It is preferable that the antireflection film is formed of a material composed mainly of tantalum oxide.

In the reflective mask blank of this invention, it is preferable a buffer film is provided between the multilayer reflective film and the absorbing film.

In the reflective mask blank of this invention, it is preferable the buffer film is formed of a material composed mainly of chromium or ruthenium.

A method of manufacturing a reflective mask according to this invention is a method of manufacturing a reflective mask by forming a transfer pattern in the reflective mask blank and includes the steps of forming the transfer pattern in the absorbing film by dry etching using as a mask a first resist film formed with the transfer pattern, dry-etching the absorbing film in a blind area using as a mask a second resist film formed with a pattern that protects the absorbing film and the multilayer reflective film in a transfer area, and dry-etching the multilayer reflective film in the blind area using the second resist film as a mask.

In the method of this invention, it is preferable that an area where the multilayer reflective film in the blind area is dry-etched is an area including at least a leakage light area.

Effect of the Invention

A reflective mask according to this invention includes a multilayer reflective film, on a substrate, having a structure in which high refractive index layers and low refractive index layers are alternately laminated, and an absorbing film stacked on the multilayer reflective film and adapted to absorb EUV exposure light. The absorbing film is a phase shift film that allows the EUV exposure light having passed therethrough and reflected by the multilayer reflective film to have a predetermined phase difference with respect to the EUV exposure light directly incident on and reflected by the multilayer reflective film. A plurality of the layers or all the layers of the multilayer reflective film in a blind area are removed from its upper layer.

According to this structure, since all the layers of the multilayer reflective film in the blind area are removed or a plurality of the layers thereof are removed to a degree such that the multilayer reflective film does not substantially have a function as a multilayer reflective film, even if the EUV exposure light leaks to the blind area, it is hardly reflected. Thus, there is an effect that even if transfer patterns are transferred on a resist film of a transfer target with almost no gap therebetween using this reflective mask such that the blind area to which the EUV exposure light leaks overlaps the adjacent transfer pattern, it is possible to suppress sensitization of the resist film of the transfer target at a portion that should not primarily be sensitized, i.e. at an overlapping portion between the blind area and an absorbing film remaining portion of the adjacent transfer pattern.

In the invention of a reflective mask blank of this invention having a conductive film, there is the following effect. In the case where a reflective mask, in which all or a plurality of layers of a multilayer reflective film in a blind area are removed, is manufactured using a related reflective mask blank, it may be difficult to ensure grounding of the multilayer reflective film in a transfer area which is most apt to be electrostatically charged, due to a decrease in conductivity at the removed portion. Since the reflective mask blank of this invention has the conductive film between a substrate and a multilayer reflective film, there is an effect that the multilayer reflective film in a transfer area can be easily grounded by grounding the conductive film.

MODE FOR CARRYING OUT THE INVENTION

Figure 1:
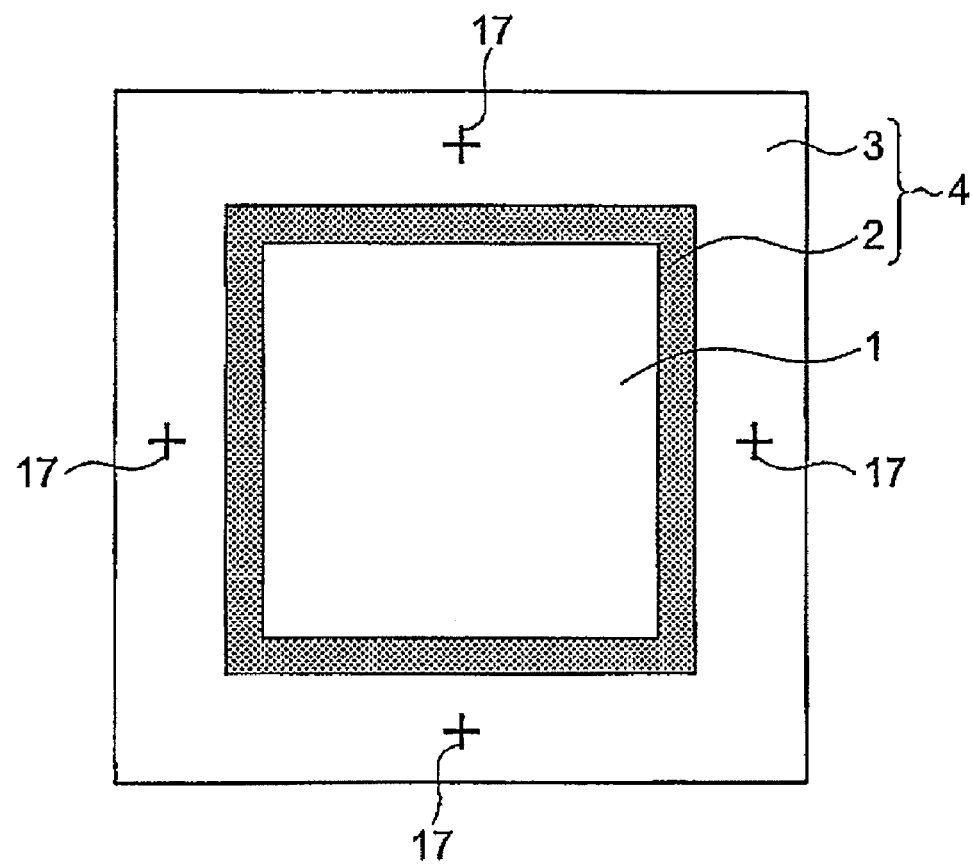
FIG. 1 is a diagram for explaining a transfer area in a reflective mask.

The present inventor has paid attention to the fact that there arises a problem that, like in the case of a normal light-transmissive halftone mask, when transfer patterns are transferred on a resist film of a transfer target with no gap therebetween, the resist film is sensitized at an overlapping portion therebetween also in the case of an EUV exposure reflective mask that uses the theory of the halftone mask, and has found that, by removing a plurality of layers or all layers of a multilayer reflective film from its upper layer in a blind area to thereby largely reduce the reflectance of the blind area, it is possible to largely reduce the quantity of EUV exposure light that is, after leaking to the blind area, reflected therefrom to expose a resist film of a transfer target, and thus to suppress sensitization of the resist film, thereby completing this invention.

That is, the gist of this invention is such that an absorbing film stacked on a multilayer reflective film and adapted to absorb EUV exposure light is formed by a phase shift film that allows the EUV exposure light having passed therethrough and reflected by the multilayer reflective film to have a predetermined phase difference with respect to the EUV exposure light directly incident on and reflected by the multilayer reflective film, and a plurality of layers or all layers of the multilayer reflective film in a blind area are removed from its upper layer to largely reduce the reflectance of the blind area, thereby largely reducing the quantity of the EUV exposure light that is, after leaking to the blind area, reflected therefrom to expose a resist film of a transfer target, thus suppressing sensitization of the resist film of the transfer target at a portion where a low-reflection portion of a transfer area and the blind area overlap each other.

In this invention, with respect to a range where the plurality of layers or all the layers of the multilayer reflective film in the blind area are removed from its upper layer, it is required that the layers be removed at least in a range over which the EUV exposure light leaks. Since the range over which the EUV exposure light leaks differs depending on an exposure apparatus to be used, the range of removing the multilayer reflective film should be selected according to the specification of the exposure apparatus. If the multilayer reflective film is removed over the entire blind area except at portions used for alignment marks, the function and effect of this invention can be exhibited regardless of the specification of an exposure apparatus.

However, in consideration of the case where it is desired to leave a large area for allocation of various marks such as alignment marks, or of the etching time and cost for removing the absorbing film and the multilayer reflective film, it is not necessarily best to remove the multilayer reflective film over the entire blind area. In the case where it is desired to leave the absorbing film and the multilayer reflective film in the blind area as much as possible, if, for example, the multilayer reflective film in the blind area is removed in an outer peripheral region of about 5 mm outside the outer peripheral boundary of the transfer area, the function and effect of this invention can be exhibited. In the case where the positional accuracy of an exposure apparatus is high, if the multilayer reflective film in the blind area is removed in an outer peripheral region of about 3 mm outside the outer peripheral boundary of the transfer area, the function and effect of this invention can be exhibited. The outer peripheral region shall be an area including a leakage light area.

Hereinbelow, embodiments of this invention will be described in detail with reference to the accompanying drawings.

FIG. 1 is a diagram for explaining a transfer area in a reflective mask. The reflective mask shown in FIG. 1 includes a transfer area 1 for transferring a transfer pattern and a blind area 4 being an area which is provided to surround the transfer area 1 and is formed with no transfer pattern. The blind area 4 is provided with a leakage light area 2 which is an area being in contact with the transfer area 1 and to which EUV exposure light leaks, and with an outside area 3 which is an area surrounding the leakage light area 2 and in which alignment marks 17 for use in alignment at the time of pattern transfer, or the like are patterned.

(Embodiment 1)

In this embodiment, a description will be given of a structure in which all layers of a multilayer reflective film (13 in FIG. 3D) in the leakage light area 2 of the blind area 4 are removed from its upper layer. A reflective mask according to this embodiment has a structure shown in FIG. 3D. The reflective mask shown in FIG. 3D mainly comprises a substrate 11, a conductive film 12 formed on the substrate 11, a multilayer reflective film 13 formed on the conductive film 12 in the transfer area 1, a buffer film 14 formed in a pattern on the multilayer reflective film 13 for protecting the multilayer reflective film 13, and an absorbing film 15 formed on the buffer film 14. That is, the reflective mask shown in FIG. 3D has a structure in which the multilayer reflective film 13 is formed in the transfer area 1, a laminated film of the buffer film 14 and the absorbing film 15 is formed in a pattern on the multilayer reflective film 13, and the multilayer reflective film 13 is not formed at least in the leakage light area 2 of the blind area 4.

The substrate 11 is required to have excellent smoothness and flatness and, as a material thereof, a glass substrate can be used. The glass substrate can be excellent in smoothness and flatness and is particularly suitable as a substrate for a mask. As a material of the glass substrate, there can be cited an amorphous glass (e.g. $SiO_2$—$TiO_2$-based glass or the like) having a low thermal expansion coefficient, a quartz glass, a crystallized glass precipitated with β-quartz solid solution, or the like.

Depending on the number of removed layers of the multilayer reflective film 13, particularly in the case where all the layers are removed as in this embodiment 1, although, as described before, grounding is necessary for the multilayer reflective film 13 in the transfer area 1 to discharge electrostatic charges generated by irradiation of EUV light, the conductivity becomes insufficient due to the removal of the multilayer reflective film 13. In order to ensure this conductivity, the conductive film 12 is formed on an upper surface of the substrate in this embodiment 1. By grounding the conductive film 12, the multilayer reflective film 13 in the transfer area 1 can be easily grounded.

Further, the conductive film 12 also serves as an etching stopper of the multilayer reflective film 13. Therefore, it is desirable that the conductive film 12 have sufficient conductivity and simultaneously have resistance to an etching gas for the multilayer reflective film 13. For example, when the etching gas for the multilayer reflective film 13 is a fluorine gas, the conductive film 12 is preferably formed of a material composed mainly of one of chromium, chromium nitride, chromium oxide, chromium carbide, chromium oxynitride, chromium carbonitride, chromium oxycarbide, and chromium oxycarbonitride.

The multilayer reflective film 13 formed on the conductive film 12 has a structure in which a high refractive index material (high refractive index layers) and a low refractive index material (low refractive index layers) are alternately laminated, and is capable of reflecting light of a specific wavelength. For example, there can be cited a Mo/Si multilayer reflective film in which Mo and Si each having high reflectance for EUV light of 13 to 14 nm are alternately laminated by about 40 cycles. As examples of other multilayer reflective films for use in the region of the EUV light, there can be cited a Ru/Si cycle multilayer reflective film, a Mo/Be cycle multilayer reflective film, a Mo compound/Si compound cycle multilayer reflective film, a Si/Nb cycle multilayer reflective film, a Si/Mo/Ru cycle multilayer reflective film, a Si/Mo/Ru/Mo cycle multilayer reflective film, a Si/Ru/Mo/Ru cycle multilayer reflective film, and so on. The multilayer reflective film 13 can be formed by a well-known film forming method such as, for example, a DC magnetron sputtering method or an ion beam sputtering method.

The buffer film 14 is provided for the purpose of protecting the multilayer reflective film 13 so as to prevent it from being damaged due to an etching process in which the later-described absorbing film 15 is processed into a transfer pattern. Therefore, when, for example, tantalum boron nitride (TaBN) is used as the later-described absorbing film 15, it is preferable to use, as a material of the buffer film 14, a material composed mainly of chromium or ruthenium which is not easily etched by a chlorine gas being an etching gas for TaBN. As the material composed mainly of chromium suitable for the buffer film 14, there can be cited Cr, CrN, CrO, CrC, CrON, CrCN, CrOCN, or the like. As the material composed mainly of ruthenium suitable for the buffer film 14, there can be cited Ru, RuNb, RuZr, RuMo, RuY, RuB, RuTi, RuLa, or the like. The thickness of the buffer film 14 is 100 nm or less and preferably 80 nm or less. The buffer film 14 can be formed using, likewise, the well-known film forming method such as the DC magnetron sputtering method or the ion beam sputtering method. The buffer film 14 may be provided according to need and thus, depending on method and conditions for pattern formation in the absorbing film 15, the absorbing film 15 may be provided directly on the multilayer reflective film 13.

The absorbing film 15 is a film having a function of absorbing EUV light and is a phase shift film that allows EUV exposure light having passed therethrough and reflected by the multilayer reflective film 13 to have a predetermined phase difference with respect to EUV exposure light directly incident on and reflected by the multilayer reflective film 13. The absorbing film 15 preferably has a structure in which an antireflection film is laminated on a semitransmissive film. The absorbing film 15 is preferably formed of a material composed mainly of tantalum (Ta). The antireflection film is preferably formed of a material having etching selectivity to an etching gas for use in etching the semitransmissive film. The semitransmissive film is preferably formed of a material composed mainly of tantalum metal (Ta), tantalum boride (TaB), tantalum silicide (TaSi), or its nitride. Among them, it is particularly preferable that the semitransmissive film be formed of the material composed mainly of tantalum nitride (TaN) or tantalum boron nitride (TaBN). The antireflection film is preferably formed of a material composed mainly of tantalum oxide such as tantalum boron oxide (TaBO).

Normally, after manufacturing a reflective mask from a reflective mask blank for EUV, it is necessary to perform a pattern inspection for confirming that a transfer pattern is transferred to the mask with required accuracy. In a pattern inspection apparatus for performing this pattern inspection, not EUV light, but a light source with a longer wavelength (e.g. deep ultraviolet light of about 190 to 260 nm, visible light of a longer wavelength, or the like) is generally used as a light source of inspection light. The reason is such that an EUV light source apparatus is expensive and that, in the case of EUV light, since attenuation in the atmosphere is significant, the inside of a pattern inspection apparatus should be evacuated and thus the inspection apparatus becomes large-scale. In the pattern inspection apparatus, long-wavelength light is irradiated onto the reflective mask and the accuracy of a pattern is inspected based on the reflection contrast between the multilayer reflective film 13 and mask pattern portions (portions where the absorbing film 15 is stacked). In this event, if the absorbing film 15 comprises only the semitransmissive film of tantalum boron nitride (TaBN) or the like, there is a problem that the reflectance for the inspection light is high so that it is difficult to ensure the reflection contrast with respect to the multilayer reflective film 13. In view of this, the absorbing film 15 has the structure in which the antireflection film composed mainly of tantalum oxide having low reflectance for the inspection light is laminated on the semitransmissive film composed mainly of tantalum metal or tantalum nitride having high absorptivity for EUV light.

The absorbing film 15 serves as a halftone mask in the transfer area 1. For this purpose, assuming that the reflectance when EUV exposure light with its wavelength is directly incident on and reflected by the multilayer reflective film 13 (arrows A in FIG. 3D) is given as a reference, the reflectance when the EUV exposure light is transmitted through the absorbing film 15 and the buffer film 14 to be incident on and reflected by the multilayer reflective film 13 and is again transmitted through the buffer film 14 and the absorbing film 15 (arrows B in FIG. 3D) is preferably 5% to 20%. Further, the phase difference between reflected light through the absorbing film 15 (reflected light of arrows B in FIG. 3D) and reflected light in the case of the direct incidence on the multilayer reflective film 13 (reflected light of arrows A in FIG. 3D) is preferably 175 degrees to 185 degrees. Accordingly, materials and thickness of the absorbing film 15 are designed so as to achieve the above-mentioned reflectance and phase difference.

At least in the leakage light area 2, since the multilayer reflective film 13 is not formed, light-shielding is more effective than at the absorbing film 15. As a result, the contrast between the reflectance of the absorbing film 15 and the reflectance of the blind area 4 where the multilayer reflective film 13 is not formed can be sufficiently obtained, and therefore, it is possible to reduce sensitization of a resist film on a transfer target in the blind area. Herein, it is considered sufficient that the contrast between the reflectance of the absorbing film 15 and the reflectance of the blind area 4 where the multilayer reflective film 13 is not formed is about 100 to 1000.

In this invention, as an etching gas for a tantalum metal-based material, a tantalum nitride-based material, or the like which can be dry-etched by a chlorine-based gas, $Cl_2$, $SiCl_4$, HCl, $CCl_4$, or $CHCl_3$, for example, is applicable. In this invention, as an etching gas for a tantalum oxide-based material, the multilayer reflective film 13 of molybdenum and silicon, or the like which should be dry-etched by a fluorine-based gas, $SF_6$, $CF_4$, $C_2F_6$, or $CHF_3$, for example, is applicable. Alternatively, it is possible to use a mixed gas of such a fluorine-based gas and He, $H_2$, Ar, $C_2H_4$, $O_2$, or the like, a chlorine-based gas such as $Cl_2$ or $CH_2Cl_2$, or a mixed gas of such a chlorine-based gas and He, $H_2$, Ar, $C_2H_4$, $O_2$, or the like. Ar, $C_2H_4$, $O_2$, or the like.

Figure 2:
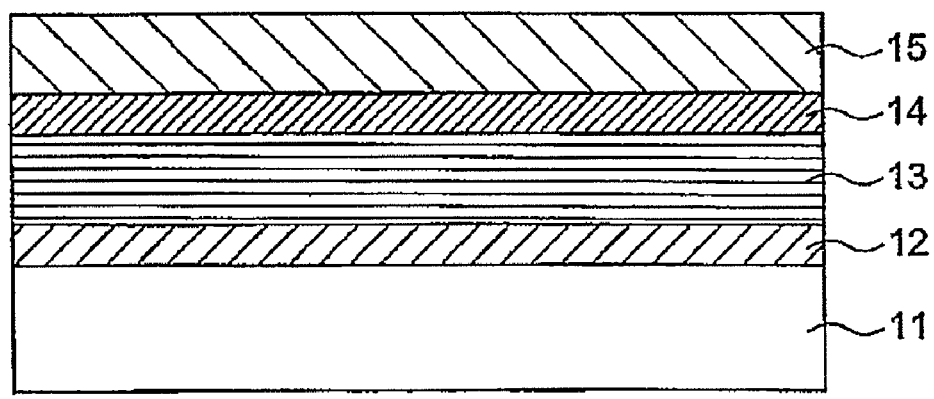
FIG. 2 is a diagram showing a reflective mask blank according to an embodiment 1 of this invention.

Herein, a manufacturing method of the reflective mask according to this embodiment will be described with reference to the drawings. FIG. 2 is a diagram showing a reflective mask blank according to the embodiment 1 of this invention and FIGS. 3A to 3D are diagrams for explaining a method of manufacturing a reflective mask using the reflective mask blank shown in FIG. 2.

First, as shown in FIG. 2, there is prepared a mask blank comprising a substrate 11, a conductive film 12, a multilayer reflective film 13, a buffer film 14, and an absorbing film (semitransmissive film and antireflection film) 15 which are formed in this order. In this mask blank, the conductive film 12 is interposed between the substrate 11 and the multilayer reflective film 13. Specifically, the conductive film 12 is formed on the substrate 11 by sputtering or the like. Then, by ion beam sputtering or the like, the multilayer reflective film 13 is formed on the conductive film 12 by alternately laminating Mo and Si which are suitable as reflective films in the region of an exposure wavelength 13 to 14 nm being a wavelength of EUV light. For example, a Si film is formed using a Si target, then a Mo film is formed using a Mo target and, given that this forms one cycle, Si and Mo films are laminated by 40 cycles and, finally, a Si film is formed. Then, the buffer film 14 is formed on the multilayer reflective film 13 by DC magnetron sputtering or the like. Thereafter, on the buffer film 14, the absorbing film 15 is formed by laminating a semitransmissive film and an antireflection film in this order by DC magnetron sputtering or the like. A reflective mask is manufactured by forming a transfer pattern in this mask blank.

Figure 3A:
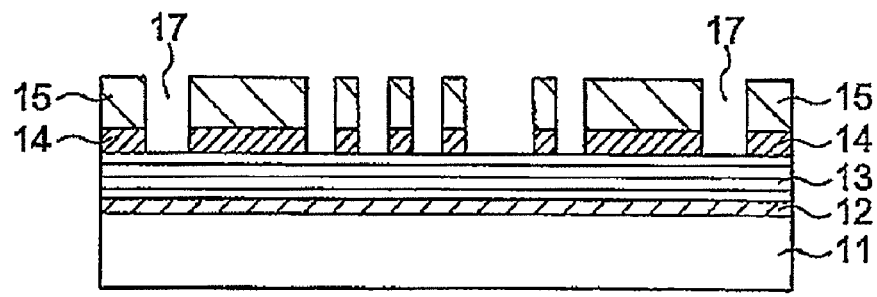
FIG. 3A is a diagram for explaining a method of manufacturing a reflective mask using the reflective mask blank shown in FIG. 2.
Figure 3B:
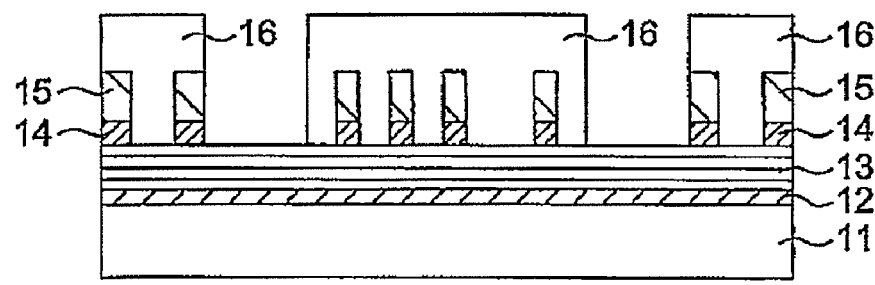
FIG. 3B is a diagram for explaining a manufacturing process subsequent to FIG. 3A.
Figure 3C:
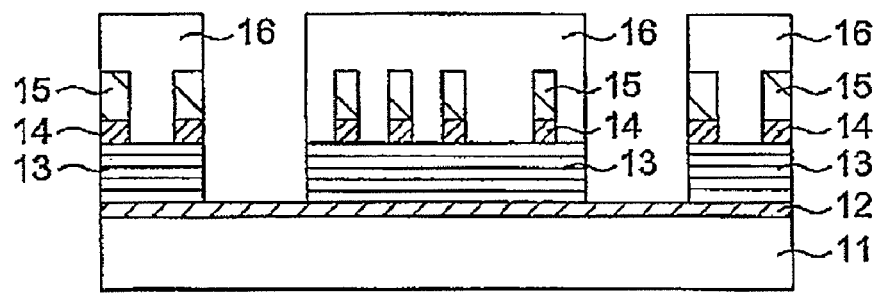
FIG. 3C is a diagram for explaining a manufacturing process subsequent to FIG. 3B.
Figure 3D:
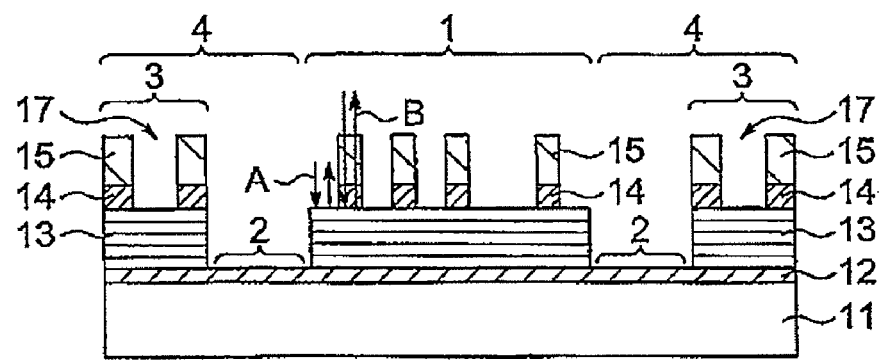
FIG. 3D is a diagram for explaining a manufacturing process subsequent to FIG. 3C.

First, a resist film is formed on the mask blank shown in FIG. 2. Then, the resist film is subjected to patterning in the transfer area and patterning of various marks such as alignment marks 17 in the outside area 3 of the blind area 4, thereby forming the transfer pattern and so on in the resist film. Then, as shown in FIG. 3A, the absorbing film 15 (semitransmissive film and antireflection film) and the buffer film 14 are dry-etched using as a mask the resist film (first resist film) formed with the transfer pattern and so on, and then the resist film is removed. Then, a resist film 16 is formed on the structure shown in FIG. 3A and is patterned so that the resist film 16 (second resist film) remains over the entire transfer area 1 and the entire outside area 3. Then, as shown in FIG. 3B, the absorbing film 15 (semitransmissive film and antireflection film) and the buffer film 14 are dry-etched using the resist film 16 as a mask. Then, as shown in FIG. 3C, the multilayer reflective film 13 is dry-etched using the resist film 16 as a mask. In this event, the conductive film 12 serves as an etching stopper. Thereafter, the resist film 16 is removed. In this manner, a reflective mask according to this embodiment shown in FIG. 3D is obtained.

According to this reflective mask, since the multilayer reflective film 13 is removed in the leakage light area 2 of the blind area 4, even if EUV exposure light leaks to the leakage light area 2, it is hardly reflected. Thus, even if transfer patterns are transferred on a resist film of a transfer target with almost no gap therebetween using this reflective mask such that the leakage light area 2 overlaps the adjacent transfer pattern 1, it is possible to suppress sensitization of the resist film of the transfer target at a portion that should not primarily be sensitized, i.e. at an overlapping portion between the leakage light area 2 and a remaining portion of the absorbing film 15 in the adjacent transfer pattern 1.

Further, since it is configured such that the conductive film 12 is provided between the substrate 11 and the multilayer reflective film 13, even if all the layers of the multilayer reflective film 13 are removed in the leakage light area 2, an electrically conducting state is ensured between the multilayer reflective film 13 in the transfer pattern 1 and the multilayer reflective film 13, the buffer film 14, and the absorbing film 15 in the outside area 3 so that the multilayer reflective film 13 in the transfer pattern 1 which tends to be electrostatically charged can be grounded.

The reflective mask of the embodiment 1 has the structure in which the multilayer reflective film 13 is not removed in the outside area 3. However, it may be configured such that the multilayer reflective film 13 is removed except at those portions where various marks such as the alignment marks 17 are formed.

(Embodiment 2)

In this embodiment, a description will be given of a structure in which a plurality of layers of a multilayer reflective film in the blind area are removed from its upper layer. A reflective mask according to this embodiment has a structure shown in FIG. 5D. The reflective mask shown in FIG. 5D mainly comprises a substrate 11, a multilayer reflective film 13 formed on the substrate 11 in the transfer area 1, a buffer film 14 formed in a pattern on the multilayer reflective film 13 for protecting the multilayer reflective film 13, and an absorbing film 15 formed on the buffer film 14. That is, the reflective mask shown in FIG. 5D has a structure in which the multilayer reflective film 13 is formed in the transfer area 1, a laminated film of the buffer film 14 and the absorbing film 15 is formed in a pattern on the multilayer reflective film 13, and a thin multilayer reflective film 13a (in a state where films corresponding to several cycles remain) is formed in the leakage light area 2 of the blind area 4. In the structure according to this embodiment, etching of the multilayer reflective film 13 is carried out so as to leave several cycles thereof and thus the conductivity is ensured between the multilayer reflective film 13 in the transfer pattern 1 and the respective films such as the multilayer reflective film 13 in the outside area 3. Further, since the etching of the multilayer reflective film 13 is controlled to be finished midway, a conductive film 12 that also serves as an etching stopper is not required. In the case where the conductivity of the multilayer reflective film 13a is expected to be insufficient to ensure grounding, the conductive film 12 may be provided. Since materials of the respective films are the same as those in the embodiment 1, a detailed description thereof will be omitted.

Figure 4:
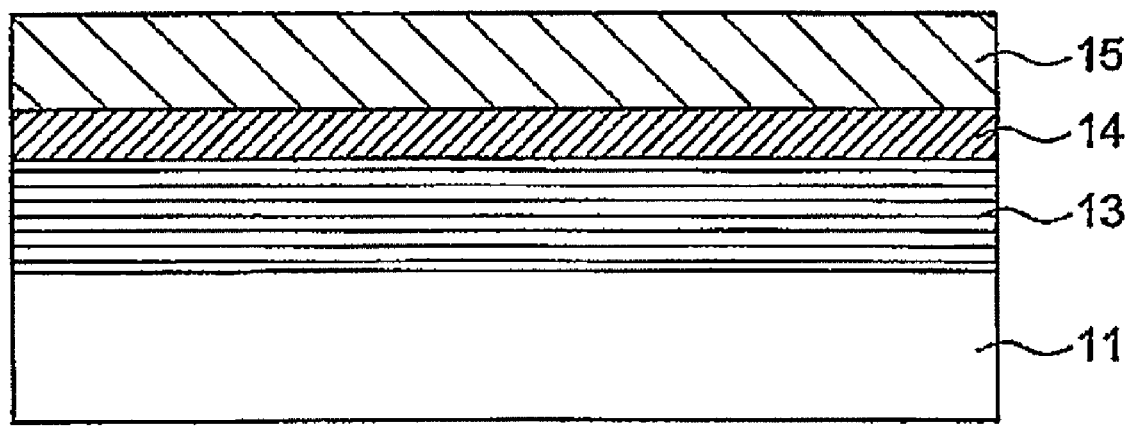
FIG. 4 is a diagram showing a reflective mask blank according to an embodiment 2 of this invention.

Herein, a manufacturing method of the reflective mask according to this embodiment will be described with reference to the drawings. FIG. 4 is a diagram showing a reflective mask blank according to the embodiment 2 of this invention and FIGS. 5(a) to 5(d) are diagrams for explaining a method of manufacturing a reflective mask using the reflective mask blank shown in FIG. 4.

First, as shown in FIG. 4, there is prepared a mask blank comprising a substrate 11, a multilayer reflective film 13, a buffer film 14, and an absorbing film (semitransmissive film and antireflection film) 15 which are formed in this order. Specifically, by ion beam sputtering or the like, the multilayer reflective film 13 is formed on the substrate 11 by alternately laminating Mo and Si which are suitable as reflective films in the region of an exposure wavelength 13 to 14 nm being a wavelength of EUV light. For example, a Si film is formed using a Si target, then a Mo film is formed using a Mo target and, given that this forms one cycle, Si and Mo films are laminated by 40 cycles and, finally, a Si film is formed. Then, the buffer film 14 is formed on the multilayer reflective film 13 by DC magnetron sputtering or the like. Thereafter, on the buffer film 14, the absorbing film 15 is formed by laminating a semitransmissive film and an antireflection film in this order by DC magnetron sputtering or the like. A reflective mask is manufactured by forming a transfer pattern in this mask blank.

Figure 5A:
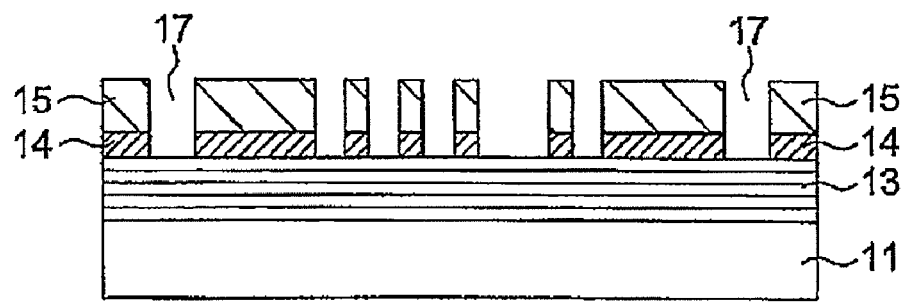
FIG. 5A is a diagram for explaining a method of manufacturing a reflective mask using the reflective mask blank shown in FIG. 4.
Figure 5B:
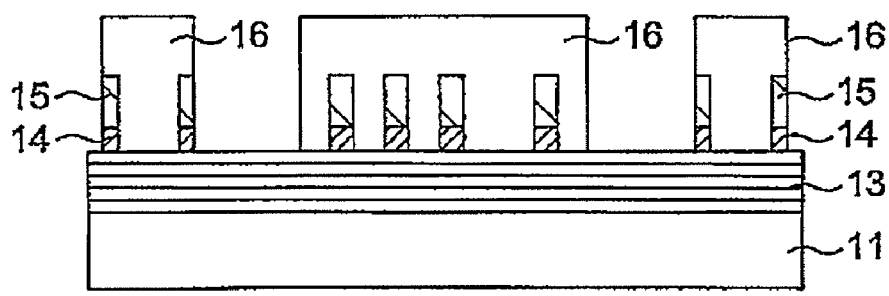
FIG. 5B is a diagram for explaining a manufacturing process subsequent to FIG. 5A.
Figure 5C:
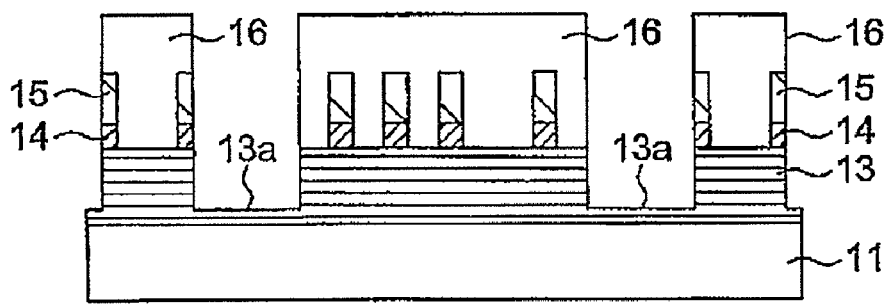
FIG. 5C is a diagram for explaining a manufacturing process subsequent to FIG. 5B.
Figure 5D:
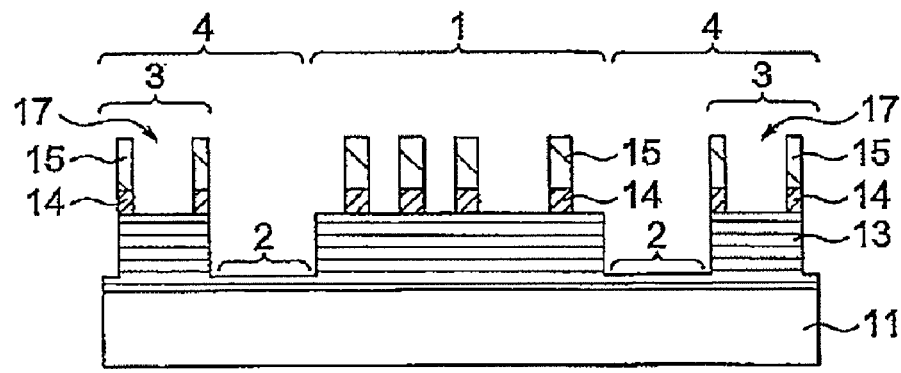
FIG. 5D is a diagram for explaining a manufacturing process subsequent to FIG. 5C.
Figure 6:
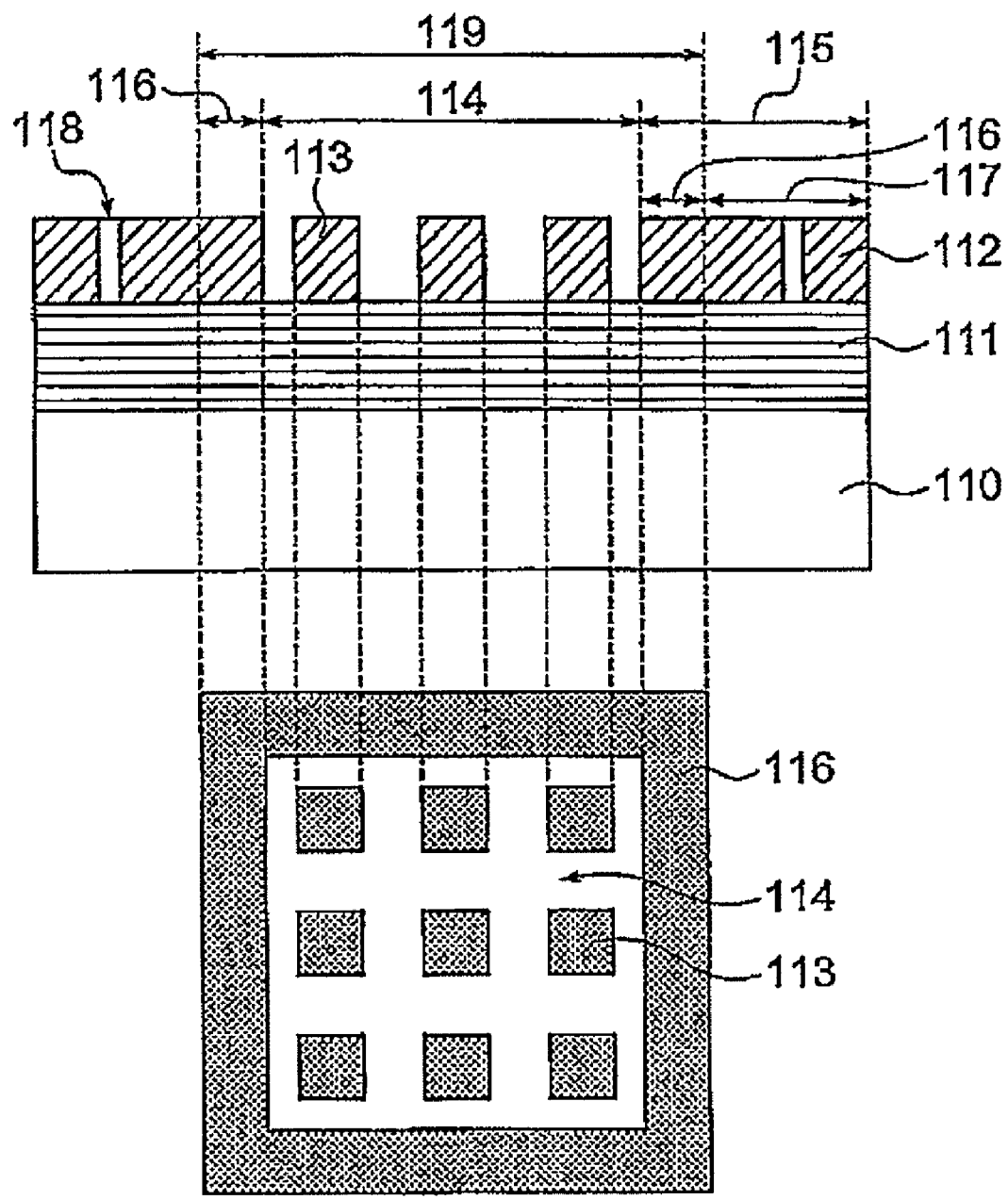
FIG. 6 includes an upper view which is a cross-sectional view showing a cross-sectional structure of a related reflective mask and a lower view which is a plan view showing a planar structure thereof.
Figure 7:
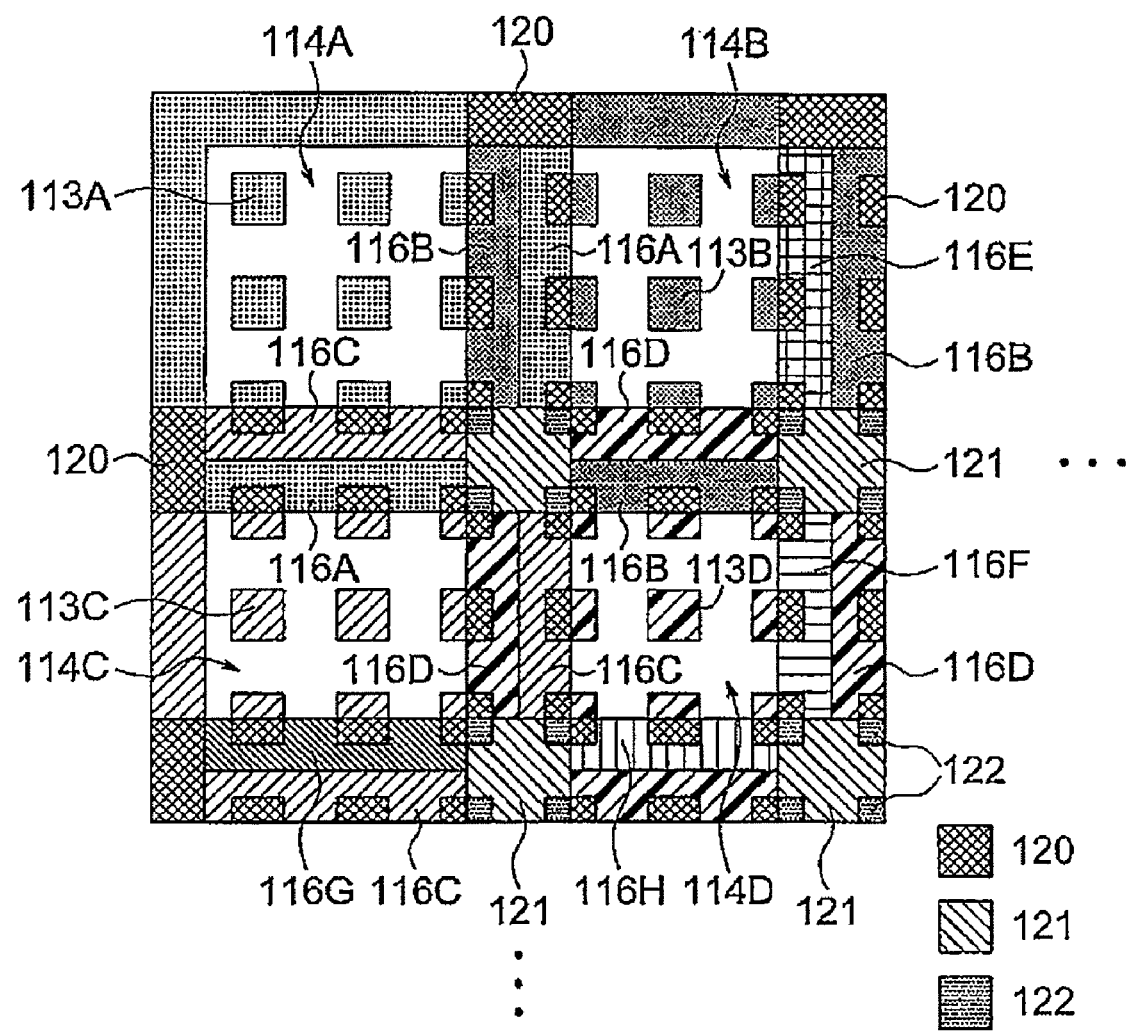
FIG. 7 is a diagram for explaining a problem when exposure is carried out using the related reflective mask.

First, a resist film is formed on the mask blank shown in FIG. 4. Then, the resist film is subjected to patterning in the transfer area and patterning of various marks such as alignment marks 17 in the outside area 3 of the blind area 4, thereby forming the transfer pattern and so on in the resist film. Then, as shown in FIG. 5A, the absorbing film 15 (semitransmissive film and antireflection film) and the buffer film 14 are dry-etched using as a mask the resist film (first resist film) formed with the transfer pattern and so on, and then the resist film is removed. Then, a resist film (second resist film) 16 is formed on the structure shown in FIG. 5A and is patterned so that the resist film 16 remains over the entire transfer area and in those regions, where various marks such as the alignment marks 17 are formed, of the outside area 3. Then, as shown in FIG. 5B, the absorbing film 15 (semitransmissive film and antireflection film) and the buffer film 14 are dry-etched using the resist film 16 as a mask. Then, as shown in FIG. 5C, a plurality of the layers of the multilayer reflective film 13 are dry-etched using the resist film 16 as a mask. In this event, so as to allow the multilayer reflective film 13a to remain with several cycles or several layers thereof, the etching conditions are appropriately set in consideration of the film materials, an etching gas, and so on. Thereafter, the resist film 16 is removed. In this manner, a reflective mask according to this embodiment shown in FIG. 5D is obtained.

According to this reflective mask, since the multilayer reflective film 13 in the leakage light area 2 of the blind area 4 is removed to the degree such that the multilayer reflective film 13a remains with several cycles or several layers thereof, even if EUV exposure light leaks to the leakage light area 2, it is hardly reflected. Thus, even if transfer patterns are transferred on a resist film of a transfer target with almost no gap therebetween using this reflective mask such that the leakage light area 2 overlaps the adjacent transfer pattern 1, it is possible to suppress sensitization of the resist film of the transfer target at a portion that should not primarily be sensitized, i.e. at an overlapping portion between the leakage light area 2 and a remaining portion of the absorbing film 15 in the adjacent transfer pattern 1.

Further, since the multilayer reflective film in the leakage light area 2 remains with several cycles or several layers thereof, an electrically conducting state is ensured between the multilayer reflective film 13 in the transfer pattern 1 and the multilayer reflective film 13, the buffer film 14, and the absorbing film 15 in the outside area 4 so that the multilayer reflective film 13 in the transfer pattern 1 which tends to be electrostatically charged can be grounded.

The reflective mask of the embodiment 2 has the structure in which the multilayer reflective film 13 is removed except at those portions where various marks such as the alignment marks 17 are formed. However, like in the embodiment 1, it may be configured such that the multilayer reflective film 13 is not removed in the outside area 4.

Next, a description will be given of Examples carried out for clarifying the effect of this invention.

Example 1

First, as a substrate, there was prepared a low-expansion $SiO_2$—$TiO_2$-based glass substrate having an external shape of 152 mm square with a thickness of 6.3 mm. Then, chromium nitride (CrN: N=10 at %) was coated on the substrate by DC magnetron sputtering, thereby forming a conductive film having a thickness of 5 nm. Then, Mo and Si suitable as reflective films in the region of an exposure wavelength 13 to 14 nm being a wavelength of EUV light were coated on the conductive film by ion beam sputtering, thereby forming a multilayer reflective film having a total thickness of 284 nm (Mo:2.8 nm, Si:4.2 nm, given that this forms one cycle, Si and Mo films were laminated by 40 cycles and, finally, a Si film was formed to 4 nm thick).

Then, chromium nitride (CrN: N=10 at %) was coated on the multilayer reflective film by DC magnetron sputtering, thereby forming a buffer film having a thickness of 10 nm. Then, TaN was coated on the buffer film by DC magnetron sputtering, thereby forming a semitransmissive film having a thickness of 28 nm. In this event, the film formation was carried out using a tantalum target and using an Ar gas added with 40% nitrogen. The composition ratio of the formed TaN film was Ta:N=70:30.

Then, TaO was coated on the semitransmissive film by DC magnetron sputtering, thereby forming an antireflection film having a thickness of 14 nm. In this event, the film formation was carried out using a tantalum target and using an Ar gas added with 25% oxygen. The composition ratio of the formed TaO film was Ta: 0=30:70. In this manner, a reflective mask blank of Example 1 was obtained (FIG. 2).

Then, the semitransmissive film (TaN film) and the antireflection film (TaO film) forming the absorbing film 15 were processed into a transfer pattern in the transfer area 1 and into various marks such as alignment marks in the outside area 3 of the blind area 4. The transfer pattern was a pattern for design rule half-pitch (hp) 45 nm DRAM (FIG. 3A).

First, an EB resist was coated on the absorbing film of the above-mentioned reflective mask blank and a predetermined resist pattern (first resist film) was formed by EB writing and development. Then, using this resist pattern as a mask, the antireflection film and the semitransmissive film forming the absorbing film were etched in this order. In this event, the TaO film was dry-etched using a fluorine-based gas ($CF_4$) and the TaN film was dry-etched using a chlorine-based gas ($Cl_2$). Then, the buffer film was etched using the antireflection film in the transfer area 1 as a mask. In this event, CrN was dry-etched using a mixed gas of chlorine and oxygen (mixing ratio was 4:1 by volume ratio). Then, after the etching, the resist film was removed.

Then, an EB resist was coated on this structure and a resist pattern (second resist film) was formed by EB writing and development so as to remain over the entire transfer area and the entire outside area 3 (FIG. 3B). Then, using this resist pattern as a mask, the multilayer reflective film was etched. In this event, the laminated film of the Si films and the Mo films was dry-etched using a fluorine-based gas ($CF_4$) (FIG. 3C). Thereafter, the resist film was removed, thereby manufacturing a reflective mask of Example 1 (FIG. 3D).

Using the reflective mask thus manufactured, exposure was carried out on a single transfer target formed with a resist film such that adjacent transfer patterns were arranged with no gap therebetween, i.e. the leakage light area 2 of the blind area 4 overlapped the adjacent transfer pattern 1. As a result, it was possible to suppress sensitization of the resist film, irrelevant to the transfer pattern, at an overlapping portion. This is considered to be because since the multilayer reflective film 13 is not present in the leakage light area 2, EUV light leaking to the leakage light area 2 is hardly reflected and thus gives no influence on sensitization of the resist film for the adjacent transfer pattern.

It was also confirmed that, during consecutive exposure on this transfer target, there was no disadvantage of the occurrence of charge-up of the multilayer reflective film 13 of the reflective mask and thus electrostatic charges of the multilayer reflective film 13 in the transfer area were fully released by grounding, and therefore, the conductivity was sufficiently ensured by the conductive film 12.

Example 2

First, as a substrate, there was prepared a low-expansion $SiO_2$—$TiO_2$-based glass substrate having an external shape of 152 mm square with a thickness of 6.3 mm. Then, chromium nitride (CrN: N=10 at %) was coated on the substrate by DC magnetron sputtering, thereby forming a conductive film having a thickness of 5 nm. Then, Mo and Si suitable as reflective films in the region of an exposure wavelength 13 to 14 nm being a wavelength of EUV light were coated on the conductive film by ion beam sputtering, thereby forming a multilayer reflective film having a total thickness of 284 nm (Mo:2.8 nm, Si:4.2 nm, given that this forms one cycle, Si and Mo films were laminated by 40 cycles and, finally, a Si film was formed to 4 nm thick).

Then, chromium nitride (CrN: N=10 at %) was coated on the multilayer reflective film by DC magnetron sputtering, thereby forming a buffer film having a thickness of 10 nm. Then, TaBN was coated on the buffer film by DC magnetron sputtering, thereby forming a semitransmissive film having a thickness of 30 nm. In this event, the film formation was carried out using a sintered body target containing tantalum and boron and using an Ar gas added with 40% nitrogen. The composition ratio of the formed TaBN film was Ta:B:N=60:10:30.

Then, TaBO was coated on the semitransmissive film by DC magnetron sputtering, thereby forming an antireflection film having a thickness of 14 nm. In this event, the film formation was carried out using a sintered body target containing tantalum and boron and using an Ar gas added with 25% oxygen. The composition ratio of the formed TaBO film was Ta:B:O=30:10:60. In this manner, a reflective mask blank of Example 2 was obtained (FIG. 2).

Then, the semitransmissive film (TaBN film) and the antireflection film (TaBO film) forming an absorbing film were processed into a transfer pattern in the transfer area 1 and into various marks such as alignment marks in the outside area 3 of the blind area 4. The transfer pattern was a pattern for design rule half-pitch (hp) 45 nm DRAM (FIG. 3A).

First, an EB resist was coated on the absorbing film of the above-mentioned reflective mask blank and a predetermined resist pattern (first resist film) was formed by EB writing and development. Then, using this resist pattern as a mask, the antireflection film and the semitransmissive film forming the absorbing film were etched in this order. In this event, the TaBO film was dry-etched using a fluorine-based gas ($CF_4$) and the TaBN film was dry-etched using a chlorine-based gas ($Cl_2$). Then, the buffer film was etched using the antireflection film in the transfer area as a mask. In this event, CrN was dry-etched using a mixed gas of chlorine and oxygen (mixing ratio was 4:1 by volume ratio). Then, after the etching, the resist film was removed.

Then, an EB resist was coated on this structure and a resist pattern (second resist film) was formed by EB writing and development so as to remain over the entire transfer area and the entire outside area 3 (FIG. 3B). Then, using this resist pattern as a mask, the multilayer reflective film was etched. In this event, the laminated film of the Si films and the Mo films was dry-etched using a fluorine-based gas ($CF_4$) (FIG. 3C). Thereafter, the resist film was removed, thereby manufacturing a reflective mask of Example 2 (FIG. 3D).

Using the reflective mask thus manufactured, exposure was carried out on a single transfer target formed with a resist film such that adjacent transfer patterns were arranged with no gap therebetween, i.e. the leakage light area 2 of the blind area 4 overlapped the adjacent transfer pattern 1. As a result, it was possible to suppress sensitization of the resist film, irrelevant to the transfer pattern, at an overlapping portion. This is considered to be because since the multilayer reflective film 13 is not present in the leakage light area 2, EUV light leaking to the leakage light area 2 is hardly reflected and thus gives no influence on sensitization of the resist film for the adjacent transfer pattern.

It was also confirmed that, during consecutive exposure on this transfer target, there was no disadvantage of the occurrence of charge-up of the multilayer reflective film 13 of the reflective mask and thus electrostatic charges of the multilayer reflective film 13 in the transfer area were fully released by grounding, and therefore, the conductivity was sufficiently ensured by the conductive film 12.

Example 3

First, as a substrate, there was prepared a low-expansion $SiO_2$—$TiO_2$-based glass substrate having an external shape of 152 mm square with a thickness of 6.3 mm. Then, Mo and Si suitable as reflective films in the region of an exposure wavelength 13 to 14 nm being a wavelength of EUV light were coated on the substrate by ion beam sputtering, thereby forming a multilayer reflective film having a total thickness of 284 nm (Mo:2.8 nm, Si:4.2 nm, given that this forms one cycle, Si and Mo films were laminated by 40 cycles and, finally, a Si film was formed to 4 nm thick).

Then, chromium nitride (CrN: N=10 at %) was coated on the multilayer reflective film by DC magnetron sputtering, thereby forming a buffer film having a thickness of 10 nm. Then, TaN was coated on the buffer film by DC magnetron sputtering, thereby forming a semitransmissive film having a thickness of 28 nm. In this event, the film formation was carried out using a tantalum target and using an Ar gas added with 40% nitrogen. The composition ratio of the formed TaN film was Ta:N=70:30.

Then, TaO was coated on the semitransmissive film by DC magnetron sputtering, thereby forming an antireflection film having a thickness of 14 nm. In this event, the film formation was carried out using a tantalum target and using an Ar gas added with 25% oxygen. The composition ratio of the formed TaO film was Ta:O=30:70. In this manner, a reflective mask blank of Example 3 was obtained (FIG. 4).

Then, the semitransmissive film (TaN film) and the antireflection film (TaO film) forming the absorbing film were processed into a transfer pattern in the transfer area 1 and into various marks such as alignment marks in the outside area 3 of the blind area 4. The transfer pattern was a pattern for design rule half-pitch (hp) 45 nm DRAM (FIG. 5A).

First, an EB resist was coated on the absorbing film of the above-mentioned reflective mask blank and a predetermined resist pattern (first resist film) was formed by EB writing and development. Then, using this resist pattern as a mask, the antireflection film and the semitransmissive film forming the absorbing film were etched in this order. In this event, the TaO film was dry-etched using a fluorine-based gas ($CF_4$) and the TaN film was dry-etched using a chlorine-based gas ($Cl_2$). Then, the buffer film was etched using the antireflection film in the transfer area as a mask. In this event, CrN was dry-etched using a mixed gas of chlorine and oxygen (mixing ratio was 4:1 by volume ratio). Then, after the etching, the resist film was removed.

Then, an EB resist was coated on this structure and a resist pattern (second resist film) was formed by EB writing and development so as to leave the entire transfer area and various marks such as the alignment marks 17 in the outside area 3 (FIG. 5B). Then, using this resist pattern as a mask, etching of the multilayer reflective film was carried out to leave about 5 cycles thereof (effect is sufficient with approximately 5 cycles, not necessarily with exactly 5 cycles). In this event, the laminated film of the Si films and the Mo films was dry-etched using a fluorine-based gas ($CF_4$) by controlling the etching time (FIG. 5C). Thereafter, the resist film was removed, thereby manufacturing a reflective mask of Example 3 (FIG. 5D).

Using the reflective mask thus manufactured, exposure was carried out on a single transfer target formed with a resist film such that adjacent transfer patterns were arranged with no gap therebetween, i.e. the leakage light area 2 of the blind area 4 overlapped the adjacent transfer pattern 1. As a result, it was possible to suppress sensitization of the resist film, irrelevant to the transfer pattern, at an overlapping portion. This is considered to be because since the multilayer reflective film 13 is present with only several cycles thereof in the leakage light area 2 and thus does not substantially function as a reflective film, EUV light leaking to the leakage light area 2 is hardly reflected and thus gives no influence on sensitization of the resist film for the adjacent transfer pattern.

It was also confirmed that, during consecutive exposure on this transfer target, there was no disadvantage of the occurrence of charge-up of the multilayer reflective film 13 of the reflective mask and thus electrostatic charges of the multilayer reflective film 13 in the transfer area were fully released by grounding, and therefore, the conductivity was sufficiently ensured by leaving several cycles of the multilayer reflective film 13 in the leakage light area 2.

Example 4

First, as a substrate, there was prepared a low-expansion $SiO_2$—$TiO_2$-based glass substrate having an external shape of 152 mm square with a thickness of 6.3 mm. Then, Mo and Si suitable as reflective films in the region of an exposure wavelength 13 to 14 nm being a wavelength of EUV light were coated on the substrate by ion beam sputtering, thereby forming a multilayer reflective film having a total thickness of 284 nm (Mo:2.8 nm, Si:4.2 nm, given that this forms one cycle, Si and Mo films were laminated by 40 cycles and, finally, a Si film was formed to 4 nm thick).

Then, chromium nitride (CrN: N=1 Oat %) was coated on the multilayer reflective film by DC magnetron sputtering, thereby forming a buffer film having a thickness of 10 nm. Then, TaBN was coated on the buffer film by DC magnetron sputtering, thereby forming a semitransmissive film having a thickness of 30 nm. In this event, the film formation was carried out using a sintered body target containing tantalum and boron and using an Ar gas added with 40% nitrogen. The composition ratio of the formed TaBN film was Ta:B:N=60:10:30.

Then, TaBO was coated on the semitransmissive film by DC magnetron sputtering, thereby forming an antireflection film having a thickness of 14 nm. In this event, the film formation was carried out using a sintered body target containing tantalum and boron and using an Ar gas added with 25% oxygen. The composition ratio of the formed TaBO film was Ta:B:O=30:10:60. In this manner, a reflective mask blank of Example 4 was obtained (FIG. 4).

Then, the semitransmissive film (TaBN film) and the antireflection film (TaBO film) forming an absorbing film were processed into a transfer pattern in the transfer area 1 and into various marks such as alignment marks in the outside area 3 of the blind area 4. The transfer pattern was a pattern for design rule half-pitch (hp) 45 nm DRAM (FIG. 5A).

First, an EB resist was coated on the absorbing film of the above-mentioned reflective mask blank and a predetermined resist pattern (first resist film) was formed by EB writing and development. Then, using this resist pattern as a mask, the antireflection film and the semitransmissive film forming the absorbing film were etched in this order. In this event, the TaBO film was dry-etched using a fluorine-based gas ($CF_4$) and the TaBN film was dry-etched using a chlorine-based gas ($Cl_2$). Then, the buffer film was etched using the antireflection film in the transfer area as a mask. In this event, CrN was dry-etched using a mixed gas of chlorine and oxygen (mixing ratio was 4:1 by volume ratio). Then, after the etching, the resist film was removed.

Then, an EB resist was coated on this structure and a resist pattern (second resist film) was formed by EB writing and development so as to leave the entire transfer area and various marks such as the alignment marks 17 in the outside area 3 (FIG. 5B). Then, using this resist pattern as a mask, etching of the multilayer reflective film was carried out to leave about 5 cycles thereof (effect is sufficient with approximately 5 cycles, not necessarily with exactly 5 cycles). In this event, the laminated film of the Si films and the Mo films was dry-etched using a fluorine-based gas ($CF_4$) by controlling the etching time (FIG. 5C). Thereafter, the resist film was removed, thereby manufacturing a reflective mask of Example 4 (FIG. 5D).

Using the reflective mask thus manufactured, exposure was carried out on a single transfer target formed with a resist film such that adjacent transfer patterns were arranged with no gap therebetween, i.e. the leakage light area 2 of the blind area 4 overlapped the adjacent transfer pattern 1. As a result, it was possible to suppress sensitization of the resist film, irrelevant to the transfer pattern, at an overlapping portion. This is considered to be because since the multilayer reflective film 13 is present with only several cycles thereof in the leakage light area 2 and thus does not substantially function as a reflective film, EUV light leaking to the leakage light area 2 is hardly reflected and thus gives no influence on sensitization of the resist film for the adjacent transfer pattern.

It was also confirmed that, during consecutive exposure on this transfer target, there was no disadvantage of the occurrence of charge-up of the multilayer reflective film 13 of the reflective mask and thus electrostatic charges of the multilayer reflective film 13 in the transfer area were fully released by grounding, and therefore, the conductivity was sufficiently ensured by leaving several cycles of the multilayer reflective film 13 in the leakage light area 2.

This invention is not limited to the above-mentioned embodiments 1 and 2 and can be carried out with appropriate changes thereto. For example, in the above-mentioned embodiments 1 and 2, the description has been given of the case where the CrN film is used as the material of the buffer film, but in this invention, a material composed mainly of Ru may be used instead of CrN. In this case, since the material composed mainly of Ru is highly transparent for EUV light, use as a reflective mask is made possible without removing the buffer film. The buffer film may be provided according to need and thus, depending on method and conditions for pattern formation in the absorbing film, the absorbing film may be provided directly on the multilayer reflective film. Further, in the above-mentioned embodiments 1 and 2, the description has been given of the case where the laminated film of the semitransmissive film and the antireflection film is used as the absorbing film, but other materials and structure of an absorbing film may be used. The materials, sizes, processing sequences, and so on in the above-mentioned embodiments are only examples and this invention can be carried out by changing them in various ways within a range capable of exhibiting the effect of this invention. Other than that, this invention can be carried out with appropriate changes within a range not departing from the object of this invention.

Description of Symbols 1 transfer area
2 leakage light area
3 outside area
4 blind area
11 substrate
12 conductive film
13 multilayer reflective film
14 buffer film
15 absorbing film
16 resist film (second resist film)
17 alignment mark

The invention claimed is:

1. A reflective mask produced by forming a transfer pattern in an absorbing film of a reflective mask blank comprising a multilayer reflective film, on a substrate, having a structure in which high refractive index layers and low refractive index layers are alternately laminated, and the absorbing film stacked on the multilayer reflective film and adapted to absorb EUV exposure light,
- wherein the absorbing film is a phase shift film that allows the EUV exposure light having passed therethrough and reflected by the multilayer reflective film to have a predetermined phase difference with respect to the EUV exposure light directly incident on and reflected by the multilayer reflective film,
- wherein the multilayer reflective film is adapted to reflective films for the EUV exposure light,
- wherein the absorbing film in a blind area is removed, and
- wherein a plurality of the layers or all the layers of the multilayer reflective film in the blind area are removed from its upper layer.

2. The reflective mask according to claim 1, wherein an area where the plurality of layers or all the layers of the multilayer reflective film in the blind area are removed from its upper layer is an area including at least a leakage light area.

3. The reflective mask according to claim 1, wherein the high refractive index layers are made of Mo, and the low refractive index layers are made of Si.

4. The reflective mask according to claim 1, wherein the absorbing film has a structure in which an antireflection film is laminated on a semitransmissive film.

5. The reflective mask according to claim 4, wherein the antireflection film is formed of a material having etching selectivity to an etching gas for use in etching the semitransmissive film.

6. The reflective mask according to claim 4, wherein the semitransmissive film is formed of a material composed mainly of tantalum.

7. The reflective mask according to claim 4, wherein the antireflection film is formed of a material composed mainly of tantalum oxide.

8. The reflective mask according to claim 1, wherein a buffer film is interposed between the multilayer reflective film and the absorbing film, and the buffer film is made of material containing Ru.

9. A reflective mask blank comprising a substrate, a multilayer reflective film, on the substrate, having a structure in which high refractive index layers and low refractive index layers are alternately laminated, and an absorbing film stacked on the multilayer reflective film and adapted to absorb EUV exposure light,
- wherein the absorbing film is a phase shift film that allows the EUV exposure light having passed therethrough and reflected by the multilayer reflective film to have a predetermined phase difference with respect to the EUV exposure light directly incident on and reflected by the multilayer reflective film,
- wherein the multilayer reflective film is adapted to reflective films for the EUV exposure light and
- a conductive film is interposed between the substrate and the multilayer reflective film.

10. The reflective mask blank according to claim 9, wherein the conductive film is formed of a material composed mainly of one of chromium, chromium nitride, chromium oxide, chromium carbide, chromium oxynitride, chromium carbonitride, chromium oxycarbide, and chromium oxycarbonitride.

11. The reflective mask blank according to claim 9, wherein the absorbing film has a structure in which an antireflection film is laminated on a semitransmissive film.

12. The reflective mask blank according to claim 11, wherein the antireflection film is formed of a material having etching selectivity to an etching gas for use in etching the semitransmissive film.

13. The reflective mask blank according to claim 11, wherein the semitransmissive film is formed of a material composed mainly of tantalum.

14. The reflective mask blank according to claim 11, wherein the antireflection film is formed of a material composed mainly of tantalum oxide.

15. The reflective mask blank according to claim 9, wherein a buffer film is provided between the multilayer reflective film and the absorbing film.

16. The reflective mask blank according to claim 15, wherein the buffer film is formed of a material composed mainly of chromium or ruthenium.

17. A method of manufacturing a reflective mask by forming a transfer pattern in the reflective mask blank according to claim 9, comprising the steps of
- forming the transfer pattern in the absorbing film by dry etching using as a mask a first resist film formed with the transfer pattern,
- dry-etching the absorbing film in a blind area using as a mask a second resist film formed with a pattern that protects the absorbing film and the multilayer reflective film in a transfer area, and
- dry-etching the multilayer reflective film in the blind area using the second resist film as a mask.

18. The method according to claim 17, wherein an area where the multilayer reflective film in the blind area is dry-etched is an area including at least a leakage light area.

19. The reflective mask blank according to claim 9, wherein the high refractive index layers are made of Mo, and the low refractive index layers are made of Si.

20. The reflective mask blank according to claim 9, wherein a buffer film is interposed between the multilayer reflective film and the absorbing film, and the buffer film is made of material containing Ru.

21. A reflective mask produced by forming a transfer pattern in an absorbing film of a reflective mask blank comprising a multilayer reflective film, on a substrate, having a structure in which high refractive index layers and low refractive index layers are alternately laminated, and the absorbing film stacked on the multilayer reflective film and adapted to absorb EUV exposure light,
- wherein the absorbing film is a phase shift film that allows the EUV exposure light having passed therethrough and reflected by the multilayer reflective film to have a predetermined phase difference with respect to the EUV exposure light directly incident on and reflected by the multilayer reflective film,
- wherein the multilayer reflective film is adapted to reflective films for the EUV exposure light,
- wherein the absorbing film in a blind area is removed,
- wherein all the layers of the multilayer reflective film in a blind area are removed from its upper layer,
- wherein a conductive film is interposed between the substrate and the multilayer reflective film, and
- wherein the conductive film in a blind area remains.

* * * * *